(12) United States Patent
Liu et al.

(10) Patent No.: US 8,247,730 B2
(45) Date of Patent: Aug. 21, 2012

(54) METHOD AND APPARATUS FOR FRIT SEALING WITH A VARIABLE LASER BEAM

(75) Inventors: Anping Liu, Big Flats, NY (US); Lu Zhang, Painted Post, NY (US)

(73) Assignee: Corning Incorporated, Corning, NY (US)

(*) Notice: Subject to any disclaimer, the term of this patent is extended or adjusted under 35 U.S.C. 154(b) by 873 days.

(21) Appl. No.: 11/904,696

(22) Filed: Sep. 28, 2007

(65) Prior Publication Data

US 2009/0086325 A1 Apr. 2, 2009

(51) Int. Cl.
*B23K 26/00* (2006.01)
*G02B 5/02* (2006.01)
*H01J 9/26* (2006.01)
*C03B 7/00* (2006.01)

(52) U.S. Cl. .......... 219/121.6; 359/599; 445/25; 65/207
(58) Field of Classification Search .................. 359/599; 445/25; 65/207; 219/121.6
See application file for complete search history.

(56) References Cited

U.S. PATENT DOCUMENTS

| 4,521,087 A * | 6/1985 | Hayes et al. ................. 359/503 |
| 5,704,700 A * | 1/1998 | Kappel et al. .................. 353/31 |
| 6,998,776 B2 | 2/2006 | Aitken et al. ................. 313/512 |
| 7,371,143 B2 * | 5/2008 | Becken et al. .................. 445/25 |
| 2004/0206953 A1 | 10/2004 | Morena et al. ................. 257/40 |
| 2006/0082298 A1 | 4/2006 | Becken et al. ................. 313/512 |
| 2006/0084348 A1 | 4/2006 | Becken et al. .................. 445/25 |
| 2006/0169928 A1 * | 8/2006 | Sogard et al. ............ 250/492.24 |
| 2007/0128967 A1 | 6/2007 | Becken et al. .................. 445/25 |

FOREIGN PATENT DOCUMENTS

| EP | 127045 A * | 12/1984 |
| EP | 1814181 | 8/2007 |
| WO | WO2007/067384 | 6/2007 |
| WO | WO2007/067533 | 6/2007 |

* cited by examiner

*Primary Examiner* — Henry Yuen
*Assistant Examiner* — Ket D Dang
(74) *Attorney, Agent, or Firm* — Kevin M. Able

(57) ABSTRACT

A beam shaper is implemented to seal an OLED. The beam shaper comprises a first and second lens and a beam shaper. Changing the relative position of the first, second lens and beam shaper relative to each other enables the beam shaper to generate laser beams with different shapes and intensity profiles.

15 Claims, 8 Drawing Sheets

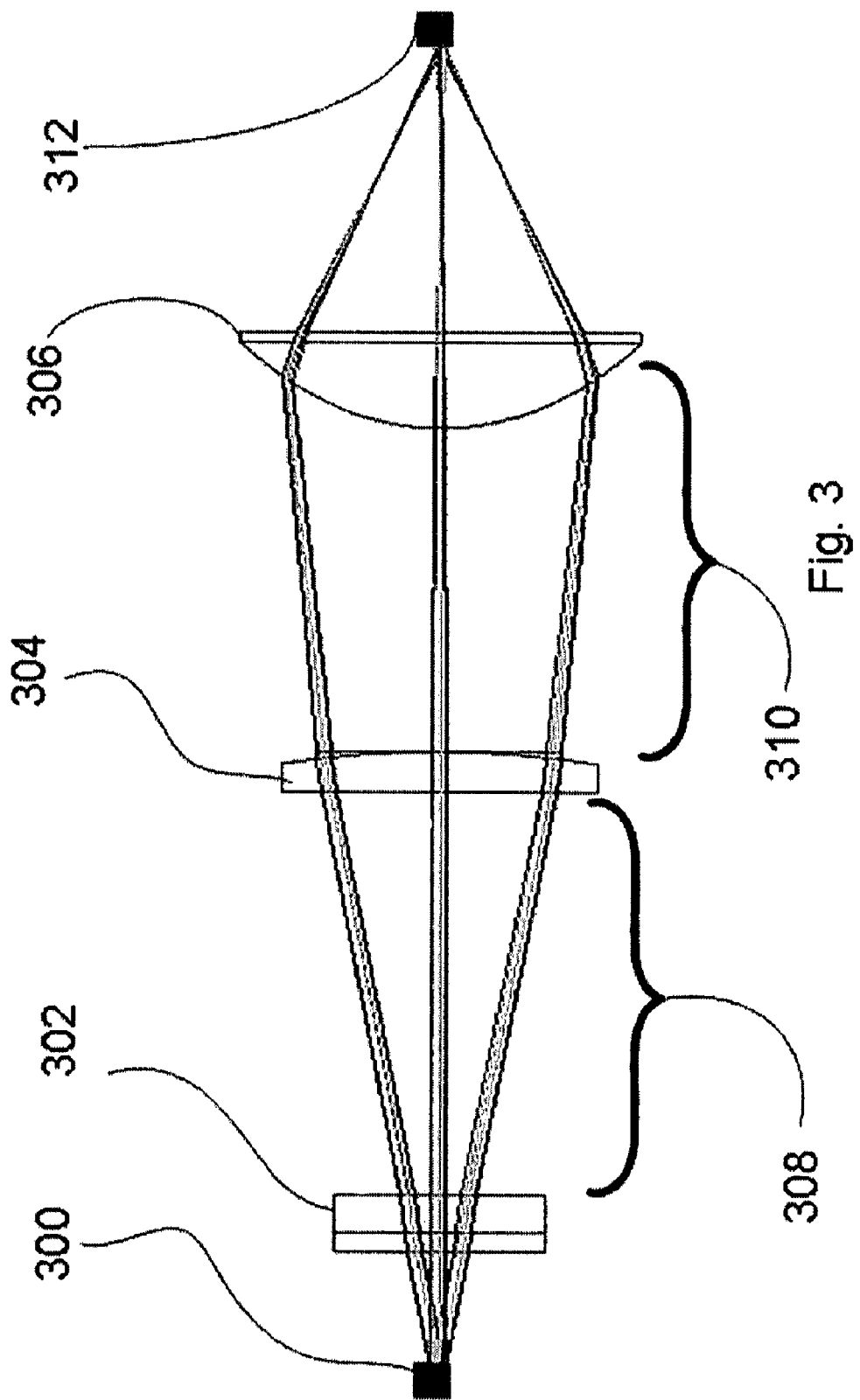

METHOD AND APPARATUS FOR FRIT SEALING WITH A VARIABLE LASER BEAM

BACKGROUND OF THE INVENTION

1. Field of the Invention

The present invention is directed to sealing Organic Light Emitting Diodes (OLEDs) and displays made of OLEDs.

2. Technical Background

As a result of the many potential applications for compact and efficient displays, organic light-emitting diodes (OLEDs) are the focus of a tremendous amount of attention. OLEDs include electrodes and organic layers. There are two types of electrodes an anode and a cathode. There are also two types of organic layers a conducting layer and an emissive layer. In conventional implementations, the OLED components are deployed on a first substrate. The first substrate is typically made of clear plastic, glass, or foil. A second substrate that is made of similar material is used to cover the OLED. The first substrate and the second substrate are hermetically sealed with a frit, encasing the OLED in a package (i.e., glass package).

During operations, the anode and the cathode (i.e., two electrodes) facilitate the flow of current through the glass package. When electricity is applied to the OLED, charge carriers (holes and electrons) are injected through the electrodes into the organic layers. As holes and electrons flow and are combined between the organic layers photons are produced to generate light.

In a number of applications OLEDs are considered as the replacement technology for the next generation of Liquid Crystal Display (LCD) and Light Emitting Diode (LED) based applications. Conventional OLEDs have a number of advantages. For example, OLEDs are found to be thinner, lighter, and more flexible than the crystalline layers in an LED or LCD. Since the light-emitting layers of an OLED are lighter, the substrate of an OLED can be flexible instead of rigid. In addition, OLEDs are brighter than LEDs, do not require backlighting like LCDs, and consume much less power than LCDs. These advantages are especially important for battery-operated devices such as cell phones and mobile computers. Lastly, OLEDs are easier to produce, can be made to large sizes, and have large fields of view. As a result of these advantages, current applications for OLEDs include small-screen devices such as cell phones, personal data assistants (PDAs), digital cameras, as well as large-screen applications such as the big-screen televisions of the future.

However, OLEDs do have a number of shortcomings. Conventional OLED manufacturing is very expensive. One issue is that OLEDs are susceptible to damage from exposure to the atmosphere. Exposing the organic layers to moisture and oxygen may cause a reduction in the useful life of an OLED. For example, OLED performance rapidly degrades in the presence of even a minute amount of moisture. To address this problem, during manufacturing, an OLED must be hermetically sealed.

In conventional OLEDs, hermetic sealing is accomplished by dispensing a frit pattern between two substrates and melting and sealing the frit to create a hermetically sealed air-tight glass package. Conventional methods of melting and sealing the frit pattern are performed with a laser.

There are a number of problems with forming a hermetic seal by using convention laser sealing methods. Electrical leads exit the glass packet to connect the OLED to other circuits. As a result, the sealing process must accommodate the electrical leads when creating the hermetic seal. Therefore, the frit must be deployed and the laser must be applied in such a way that a hermetic seal is maintained in spite of the electrical leads that cross the frit pattern.

In addition, using a laser causes a variety of negative thermal effects on the OLED. For example, the frit pattern must be dispensed on the substrate far enough away from the organic material so that the laser sealing process does not cause a thermal defect in the organic material. In addition, non-uniform laser characteristics may cause thermal damage. For example, if the laser changes in intensity profile, power, or beam size, etc., the laser may cause a non-uniform bond across the width, and length of the frit pattern, resulting in a poor hermetic seal.

One conventional method of laser sealing uses an optical mask to mitigate the problems associated with sealing across electrical leads and the thermal effects that result from sealing. However, the mask reduces useful laser power for sealing and as a result, impacts the quality of the seal and time required for sealing. Ultimately, quality and time impact the cost to manufacture and the useful life of an OLED-based product.

Therefore, it would be beneficial to address the problems associated with laser sealing an OLED. It would be beneficial to laser seal without the mask which impacts speed and quality. Lastly, it would be beneficial to seal in a manner that improves sealing strength and seal uniformity, which would ultimately increase the lifetime of OLED-based products.

SUMMARY OF THE INVENTION

A method and apparatus for laser sealing OLEDs is presented. In accordance with the teachings of the present invention a method and apparatus are presented that result in a stronger, more uniform hermetic laser seal of an OLED. In one embodiment a beam shaper is presented. The beam shaper dynamically adjusts various characteristics of the laser beam and laser operations such as the shape, size, the intensity profile, the power, the sealing speed, and the aspect ratio to achieve a stronger and more uniform, hermetic, laser seal of an OLED.

In one embodiment the beam shaper comprises an optical system that enables dynamic changes to characteristics of the laser beam such as the laser beam shape and intensity profile in real-time during the sealing process. As such, in accordance with the teachings of the present invention, the laser beam shape and intensity profile is adjusted during sealing to accommodate electrical leads, changes in the frit pattern, and the thermal issues associated with laser sealing an OLED.

In one embodiment, the beam shaper is implemented with several lenses that can be used in combination to change beam shape and several characteristics of the beam. As a result, the beam shaper provides variable beam shapes without requiring an optical mask to achieve high speed, uniform hermetic sealing of OLED devices. In one embodiment, the beam size in both the x and y directions can be independently adjusted to match a frit pattern including corner curvature, directional changes, and height variation of the frit pattern. In addition, both the laser power and the sealing speed may also be dynamically adjusted and vary along the frit pattern to achieve the best sealing performance.

In one embodiment, a method of sealing an OLED is presented. The OLED comprises a substrate and a frit pattern deployed relative to the substrate, the method comprising the steps of focusing a laser beam with characteristics of shape, size and intensity profile, onto the frit pattern; and changing at least one of the characteristic of the laser beam as the laser beam traverses the frit pattern.

In another embodiment, a method of operating a beam shaper is presented. The beam shaper comprises a first lens, a second lens, a distance between the first lens and the second lens, and a diffuser, the method comprising the steps of generating a first laser beam spot with the beam shaper; traversing a frit pattern with the first laser beam spot; and generating a second laser beam spot with the beam shaper during traversal of the frit pattern.

In another embodiment, a method of sealing a glass package is presented. The glass package comprises a first substrate, a second substrate and a frit pattern positioned between the first substrate and the second substrate, the frit pattern comprising straight sections and curved sections, the method comprising the steps of focusing a laser beam spot onto the frit pattern, the laser beam spot having a center portion and an edge portion, wherein the power at the edge portion of the laser beam spot is greater than the power at the center portion of the laser beam spot; and sealing the glass package by traversing the laser beam spot along the frit pattern.

In accordance with the teachings of the present invention, a beam shaper capable of achieving unique beam intensity profiles such as flat-top, annular, M-shaped, with different shapes such as rectangular, circular, and elliptical is provided. In one embodiment, the beam shaper is implemented by inserting an optical diffuser between the lenses of an optical system to redistribute laser beam intensity. When the optical system is implemented with the diffuser, the beam intensity profile is controlled by the diffuser while the beam size and shape are controlled by varying the relative distance between the lenses. As a result, a variety of beams can be achieved for reliable hermetic sealing.

In one embodiment, the beam shaper generates an annular beam or M-shaped beam with lower power in the center, higher power at the edges, and a precisely controlled power intensity ratio (i.e., valley to peak ratio). Compared with a conventional Gaussian laser beam with a Gaussian intensity profile, the reshaped beam can result in a uniform temperature distribution across the frit, better utilization of frit width, stronger bonding strength, less thermal effect on the adjacent components, and less damage to the substrates.

As such, a beam shaper implemented in accordance with the teachings of the present invention can be used to meet all requirements for hermetic sealing of OLED devices. The beam shaper provides improved flexibility, productivity, better sealing performance and mechanical strength. The beam shaper produces a variety of beam profiles to match specific frit sizes and patterns. The variety of beam profiles eliminates the need for custom masks. As such, a sealing system or station implemented in accordance with the teachings of the present invention can be used for mass production of a number of different products. In addition, by eliminating the mask and alignment process, the pre-production time is saved and total cost is reduced. Lastly, a beam shaper used in conjunction with low-loss glass materials can be lossless so that most of the laser power can be focused on the frit and sealing speed can be improved.

Ultimately, a beam shaper implemented in accordance with the teachings of the present invention can result in better sealing performance and stronger mechanical strength. When the beam profile is matched with the frit width, the sealing quality can be improved considerably. With the majority of the laser light (power) focused on the frit, the thermal effect on the adjacent areas is mitigated. As such, the beam shaper can provide more uniform heating (frit temperature), better utilization of frit width, stronger bonding to the substrate, less thermal effect on the adjacent components, and less damage to the substrate.

BRIEF DESCRIPTION OF THE DRAWINGS

The accompanying drawings, which are incorporated in and constitute a part of this specification, illustrate certain aspects of the instant invention and together with the description, serve to explain, without limitation, the principles of the invention.

FIG. 3 displays one embodiment of the optical system implemented in the beam shaper shown in FIG. 1;

DETAILED DESCRIPTION OF THE INVENTION

In accordance with the teachings of the present invention a method and apparatus for sealing an OLED is presented. In one embodiment a method and apparatus for dynamically shaping a laser beam onto a frit pattern is presented. The method and apparatus enables dynamic shaping of a laser beam and dynamic changes to characteristics of the laser beam in real-time during the laser sealing process. As such, variations in the frit pattern may be accommodated and a better hermetic seal may be achieved.

In one embodiment, a beam shaper is implemented using a plurality of optical lenses (i.e., optical system) that are selected or are adjusted relative to each other to dynamically shape a laser beam in real-time during the sealing process. In another embodiment, a diffuser is positioned within the optical system and the combination of the optical lenses and the diffuser are selected and/or adjusted to dynamically shape a laser beam footprint (i.e., beam size and shape) and dynamically change the characteristics of the laser beam, such as the shape, size, the intensity profile, the power, and the aspect ratio, etc, in real-time during sealing. Using the optical lenses and the diffuser, a variety of beam shapes ranging from elliptical, to square, to donut shaped, etc may be realized. In addition, in one embodiment, as the beam shape is adjusted the intensity profile may be dynamically changed to address variations in the frit and result in a better seal.

Figure 1:
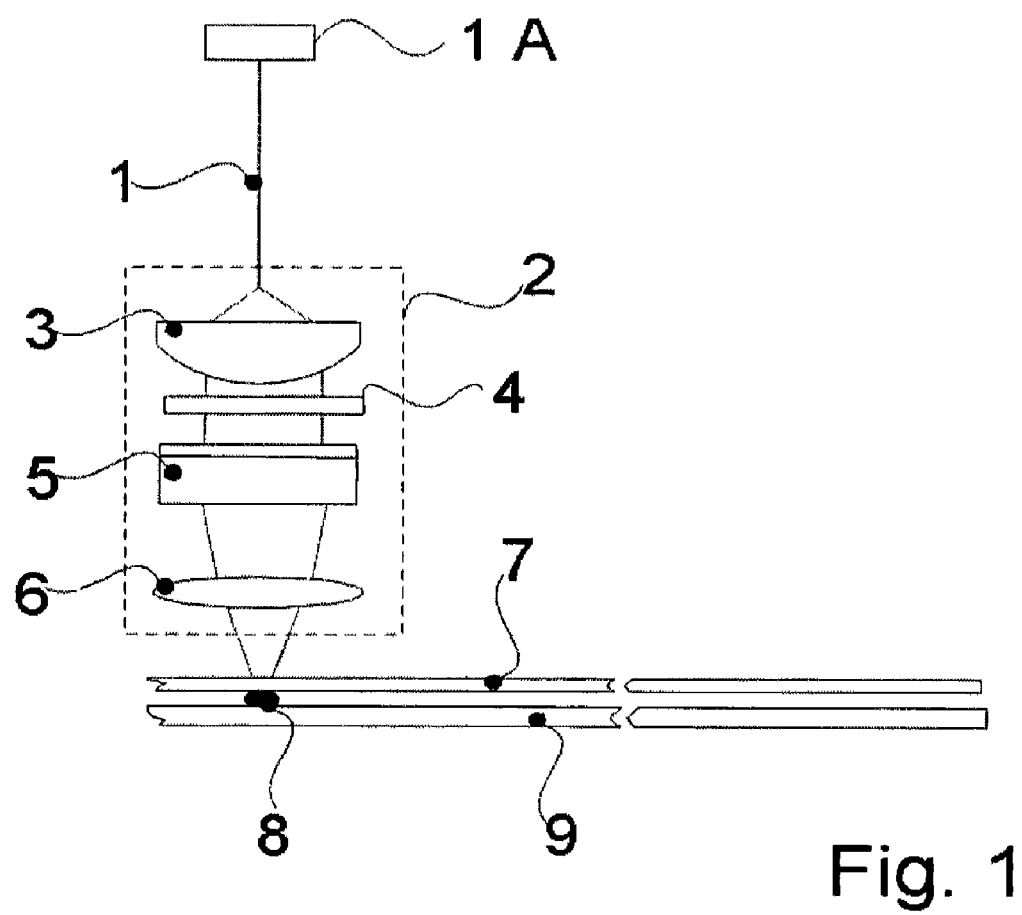
FIG. 1 displays a schematic of a beam shaper implemented in accordance with the teachings of the present invention.

FIG. 1 displays a schematic diagram of a beam shaper implemented in accordance with the teachings of the present invention. A laser beam 1 is applied to seal a frit 8 positioned between a cover substrate 7 and a support substrate 9. In one embodiment, the laser beam 1 may be generated using a laser system 1A such as a diode laser based system. The laser beam 1 may be implemented as single mode beam with diffraction-limited beam quality, or as a multi-mode beam, etc. In one embodiment, the laser beam 1 is delivered by an optical fiber to an optical system 2. The optical fiber can be single mode or multimode fiber. It should be appreciated that a variety of laser beam generating devices may be implemented and are contemplated within the scope of the present invention.

In one embodiment, the optical system 2 includes a number of lenses (3, 5, 6) for shaping the laser beam 1. In a second embodiment, the optical system 2 includes a number of lenses (3, 5, 6) and a diffuser 4 for shaping the laser beam 1. The frit 8 is positioned between a cover substrate 7 and a support substrate 9.

During operations, the optical lenses (3, 5, 6) are adjusted relative to each other to re-image the laser beam 1 to a desirable beam shape and intensity profile. For example, a laser beam 1 is re-imaged by the three lenses (3, 5, 6) onto the frit 8 through the cover substrate 7. The laser wavelength is chosen for optimal performance of both substrates and frit so that the laser is transparent to the substrates but absorbed by the frit. The laser radiation absorbed by the frit 8 leads to rapid local heating to melt the frit 8 and to form a hermetic seal between the two glass substrates (7, 9). During operations there is movement of the laser relative to the substrates (7, 9) and frit 8. For example, in one embodiment the laser beam 1 may remain stationary and the substrates (7, 9) and the frit 8 may move. In a second embodiment the optical system 2 and laser 1 may move and the substrates (7,9) and frit 8 may remain stationary. In a third embodiment both the optical system 2 and the substrates (7,9) may move relative to each other. As a result, the laser continuously melts the frit and finally forms a hermetic seal of the two substrates (7,9).

Figure 2:
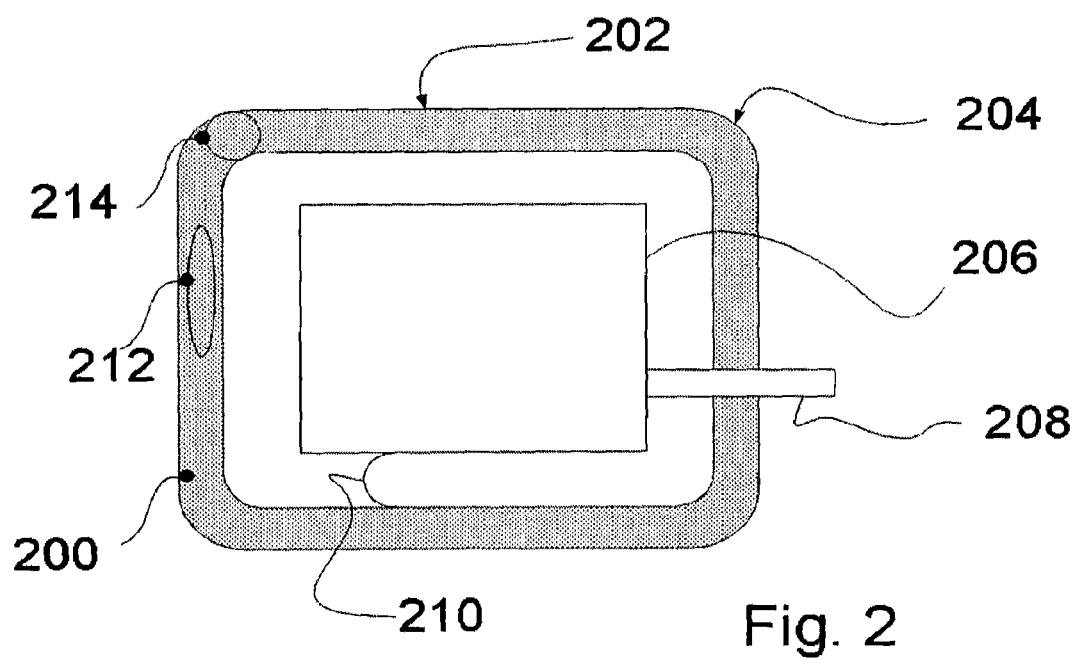
FIG. 2 displays a variable beam traversing along a frit pattern.

FIG. 2 displays a variable laser beam traversing along a frit pattern 200. For example, FIG. 2 displays the frit 8 of FIG. 1 as the frit 8 would look from the top view. A frit pattern 200 is shown (i.e., frit 8 of FIG. 1 from a top view). The frit pattern 200 changes and includes straight sections shown by 202 and curved sections shown as 204. Organic material 206 may be deployed within the boundaries of the frit pattern 200. In addition, electrical leads 208 may cross the path of the frit pattern 200. The organic material 206 is typically spaced from the frit pattern 200 as shown by 210 to avoid thermal effects resulting from the laser sealing. The footprint (212, 214) of a variable laser beam is also shown. The footprint 212 and the footprint 214 represent the same laser beam (i.e., at different times) reshaped by the beam shaper depicted in FIG. 1 as the laser beam traverses different sections of the frit pattern 200.

The footprint 212 may represent the variable laser beam as the laser traverses a straight portion 202 of the frit pattern 200. As such, footprint 212 may be implemented as an elliptical beam which may be more appropriate since an elliptical beam may cover more surface area at a higher speed on straight sections 202, while remaining within the boundaries of the straight sections 202. The footprint 214 may represent the variable laser beam as the laser traverses the curved portion 214 of the frit pattern 200. As such, footprint 214 may be implemented as a circular beam which may be more appropriate since a circular footprint may provide the appropriate dimensions and maintain uniform beam characteristics as the laser beam traverses the curved sections 204 of the frit pattern 200.

In accordance with the teachings of the present invention, during operations, a laser beam may be implemented with a first footprint such as an elliptical footprint 212, move at a first speed, operate at first power, and include a first intensity profile. In a second embodiment, for example, along the curved portion 204 of the frit pattern 200 the laser beam may be implemented with a second footprint such as a circular footprint 214, move at a second speed that is different from the first speed, operate at a power level that is different from the first power level, and provide a second intensity profile that is different from the first intensity profile. As such, the laser beam may be dynamically adjusted, in real-time, during sealing, to accommodate any non-uniformity in the frit pattern. In one embodiment, non-uniformity may include any changes in frit pattern, such as height, width, direction, etc., as well as any additional issues that effect the sealing operations or preclude a strong hermetic seal such as spacing from the organic material, obstructions in the frit pattern, requirements for temperature distribution across the frit (i.e., uniform distribution), proper utilization of frit width, strong bonding strength, thermal effect on the adjacent components, damage to the substrates, etc.

The OLED is sandwiched between a glass substrate and a cover glass which are sealed together with a frit to form a glass package. The frit seal formed by the frit pattern 200 is normally positioned on the outer edge of the glass package. The electrical leads 208 pass through the frit pattern 200 and connect to external circuits. The presence of the electrical leads 208 makes the hermetic sealing difficult as the non-transparent electrical leads 208 may cause a variation or discontinuity in the frit pattern 200 and have different absorption properties which may create uneven laser absorption and effect sealing quality. The electrical leads 208 also induce different dynamic thermal behavior because of the difference of thermal conductivity.

In accordance with the teachings of the present invention, the laser power varies when the laser encounters the electrical leads 208 so that the frit temperature can be constant to obtain best sealing quality. In one embodiment, the beam should be slightly smaller than the frit to avoid unwanted thermal effects on the electrical leads and the organic material 206.

In another embodiment, it may be beneficial to have a laser beam cover a long section of the frit so that it can seal the frit at a higher speed, as there is a relationship between the shape, the power, and the speed of sealing (i.e., traversing the laser beam across the frit pattern). For example, a first beam with a first shape and higher power may traverse the beam faster than a second beam, with a second shape, and lower power. In another example, changing the shape to elliptical, and adjusting the power, and the speed of sealing reduces residual stress during sealing as the frit can be heated and cooled slower with an elliptical beam than with a small circular beam given that the frit has longer reaction time with the laser beam (i.e., given that the elliptical shape takes a longer time to traverse a spot on the frit) and thus reduces temperature gradient and induced stress.

FIG. 3 shows an optical system implemented in accordance with the teachings of the present invention. FIG. 3 represents the three lenses (3, 5, 6) of the beam shaper 2 shown in FIG. 1. Lens 302 corresponds to lens 3 of FIG. 1, lens 304 corresponds to lens 5 of FIG. 1 and lens 306 corresponds to lens 6 of FIG. 1. In one embodiment a light source such as a laser diode 300 generates a laser which traverses through a first lens 302, a second lens 304, to a third lens 306. The laser source 300 can be a diode laser or other type of laser, such as Nd:YAG laser, fiber laser, or diode-pumped solid-state laser. The laser beam may be transported by an optical fiber.

In one embodiment, the first lens 302 may be implemented with a cylindrical lens. The second lens 304 may be implemented with a cylindrical lens and the third lens 306 may be implemented with an aspherical lens. In one embodiment, the two different cylindrical lenses (302, 304) may be used to achieve different image magnifications in two perpendicular directions (i.e., X and Y), since a cylindrical lens only effects beam propagation in one direction. The aspherical lens provides a simple way of reducing optical aberrations. As a result, a circular beam can be converted into an elliptical beam and vice versa. Therefore, in one embodiment the two cylindrical lenses may be used to adjust the size of the laser beam and the aspherical lens may be implemented to adjust the direction of the laser beam.

In one embodiment, the distances of lenses from the laser diode are 15.77 mm, 40 mm, and 35.6 mm, respectively and lens parameters as shown in Table I provided below. In one embodiment, the optical system of FIG. 3 includes of a number of optical lenses (302, 304, 306) that can provide a variable elliptical beam with aspect ratios ranging from 1.5 to at least 3.0. The aspect ratio of the laser beam may be adjusted by varying the distance between the two cylindrical lenses. The aspect ratio of the beam is appropriately chosen so that the sealing along the frit is optimal while thermal effect on the adjacent components is minimal. For example, a laser diode fiber 300 with a diameter of 1.5 mm can be converted into a 0.8×1.5 mm elliptical beam. The elliptical beam can be changed from 0.8×1.5 mm to 0.82×2.2 mm by changing the distance shown as 308 between the lens 302 and 304.

TABLE I

Lens parameters

| Lens | Type | Focal length |
|------|------|--------------|
| 302 | Cylindrical Plano Convex | 25 mm |
| 304 | Cylindrical Plano Convex | 150 mm |
| 306 | Aspherical Lenses | 34.5 mm |

Figure 4:
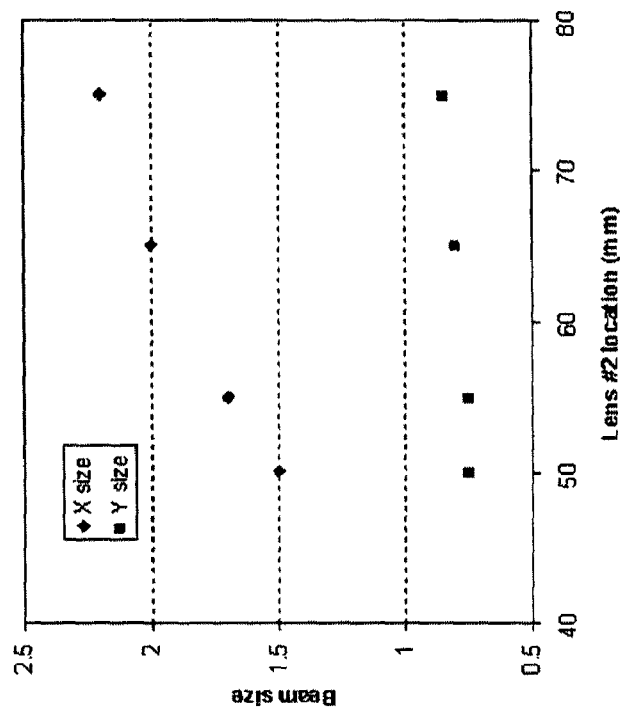
FIG. 4 displays a plot of the beam size vs. lens location.

FIG. 4 displays a plot of the beam size vs. lens location. FIG. 4 depicts how a change in the distance between lens 304 and lens 302 of FIG. 3 (i.e., 308 of FIG. 3) affects the shape of the laser beam. As shown in the graph of FIG. 4 a change in distance between lens 304 and lens 302 substantially changes the beam shape in the Y-axis but has very little impact in the X-axis. This unique feature allows the elliptical footprint of the laser beam to change at a corner of a frit pattern as shown in FIG. 2 (i.e., 214) so that it can match the changes and orientation of the frit width enabling the laser beam to traverse the corner with the appropriate laser characteristics and a better hermetic seal.

In accordance with the teachings of the present invention, it must be noted that changing beam shape leads to a power intensity change which may require a sealing speed change in order to obtain an optimal seal. The power difference can be estimated using beam size difference when the same laser power is used. For example, the power intensity difference between the straight line using a 0.82×2.2 mm beam and at the corner using a 0.8×1.5 mm beam can be [0.82×2.2/(0.8×1.5) =1.5] 50% assuming the same laser power. To obtain the same seal condition, the frit should move approximately 50% faster at the corner or alternatively the laser power should be approximately 50% lower if a constant speed is desired.

Figure 5:
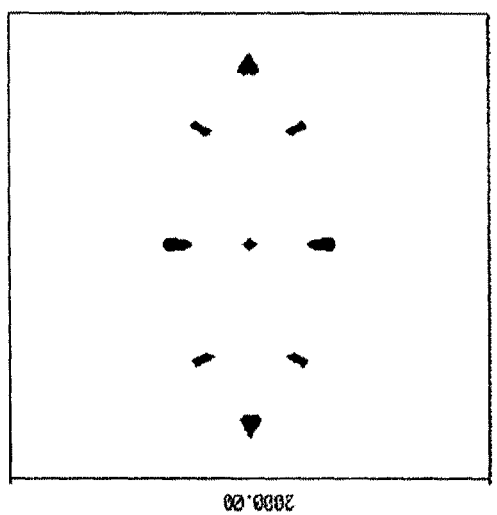
FIG. 5 displays a beam shape (outlined by a number of dots surrounding a central dot) on a focal plane as implemented in accordance with the teachings of the present invention.

FIG. 5 displays an example of the beam shape after the beam is reshaped by the beam shaper (i.e., FIG. 1). The eight dots surrounding a central dot outline the edge of the elliptical beam. A circular laser source (i.e., 300 of FIG. 3) is generated and the elliptical beam results after being processed through the optical system shown as FIG. 3. In accordance with the teachings of the present invention, when two cylindrical lenses (302, 304) are adjusted relative to each other the elliptical beam shown in FIG. 5 may be generated from a curricular laser source (i.e., 300).

Figure 6:
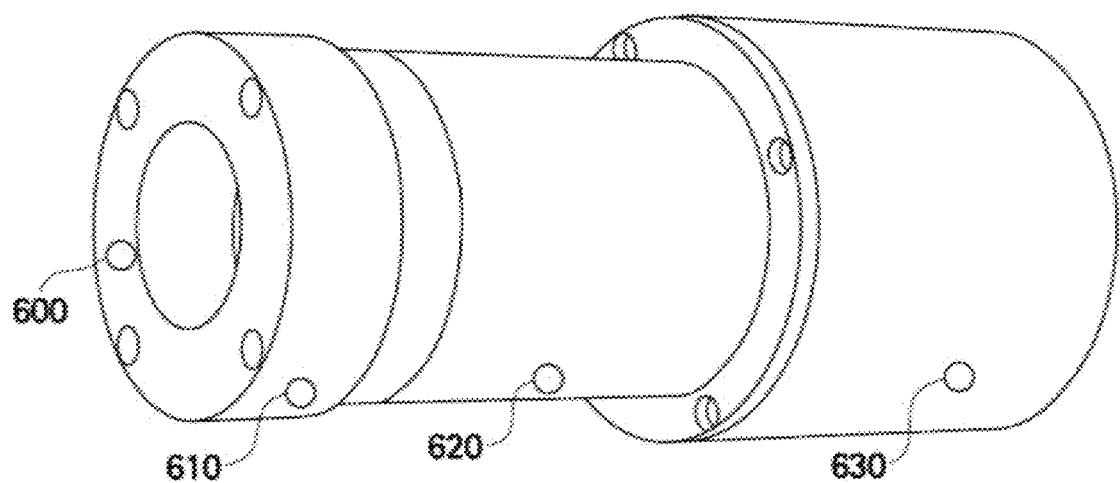
FIG. 6 displays one embodiment of a lens housing for achieving adjustable beam size and shape.

FIG. 6 displays one embodiment of a lens housing for achieving adjustable beam size and shape. The lens housing represents the physical apparatus used to implement the beam shaper of FIG. 1. In one embodiment of the present invention the adjustment of the lenses is achieved by mounting the lenses in the mechanical housing of FIG. 6. As shown in FIG. 6 the first lens 610 is mounted with respect to a first fiber mount 600 and pre-aligned, while the second cylindrical lens 620 and the aspherical lens 630 are mounted in a different housing. In one embodiment, distance changes between lenses is achieved by moving the lens 620 and 630 together while keeping the fiber and the lens 610 location unchanged. The distance change can be made manually or by a computer controlled stage. During the distance change, all lenses should remain on the same optical axis to mitigate optical distortion. One approach to changing the distance between lenses uses cylindrical mounts in which all optical components are mounted in housings using high precision cylindrical tubes. Each high precision tube has the same outer diameter and is inserted into another tube having the same inner diameter. The gaps between the outer tube and inner tubes should be less than 20 microns. The orientation of lens housing is kept in alignment by using additional pins sitting in the slot of outer tubes. The lenses can then be mounted in the housing conventional lens mounting methods or glued using adhesive. In one embodiment, each lens housing must have a high precision reference surfaces for registration of the lens position. The position tolerance for each lens is normally less than 10 microns.

It should be appreciated that while one lens configuration is shown and discussed each lens can be replaced by a more sophisticated multiple element lens consisting of a number of convex and concave lenses to optimize performance. For example, in one embodiment, the aspherical lens can also be replaced with a number of spherical lenses to achieve similar functionality.

In accordance with the teachings of the present invention, a variety of methods may be implemented to change the beam size. In one embodiment, the beam size (i.e., footprint) on the frit can be adjusted by defocusing the beam when a large beam is required. In this case, the beam can be increased to several millimeters. A larger beam size can also be achieved by changing the lens focal lengths so that a greater magnification is achieved. In one embodiment, each cylindrical lens can be replaced with a combination of convex and concave cylindrical lenses so that the effective focal length can be adjusted by varying the distance between the lenses.

Figure 7:
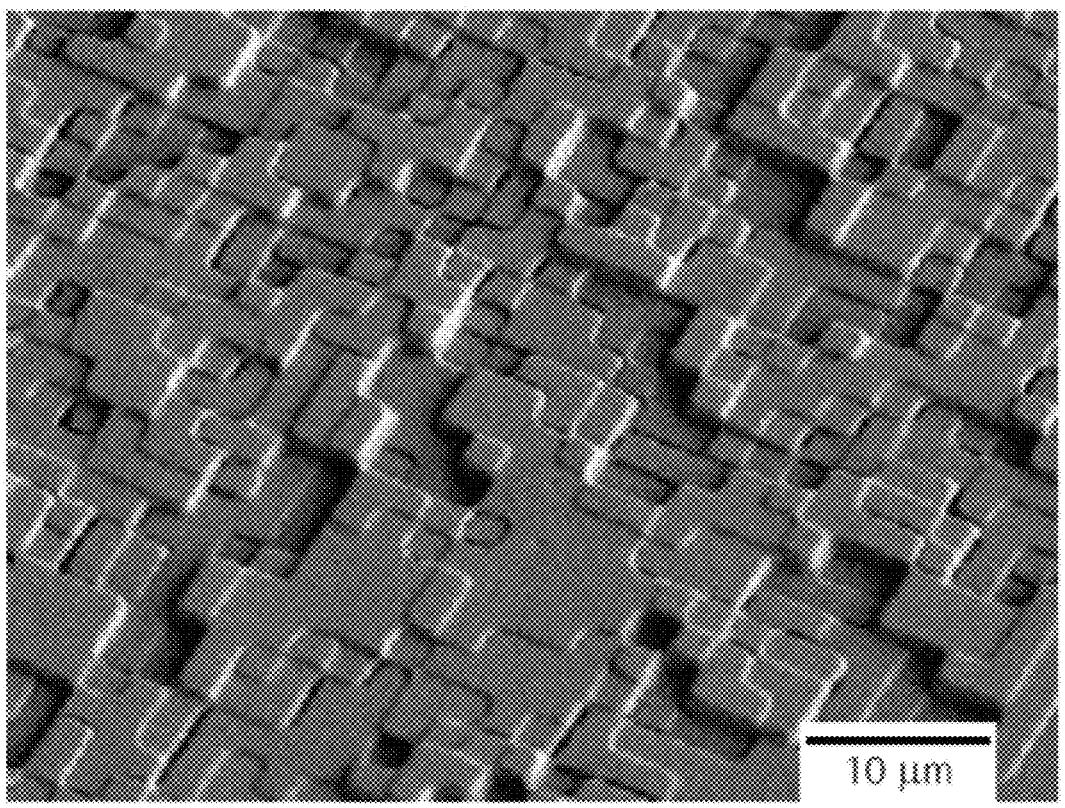
FIG. 7 displays microstructure of a diffuser surface consisting of numerous areas with specific patterns and thickness.

FIG. 7 displays a diffuser implemented in accordance with the teachings of the present invention. In one embodiment, a diffuser is defined as a diffractive optic element that receive a laser beam and redistribute the light into virtually any pattern desired.

In accordance with the teachings of the present invention, a diffuser with a micro-structure having different shapes and thickness on the surface redirects the input beam by changing the phase of each segment of the beam. In addition, the diffusers are not sensitive to alignment and do not effect the polarization of the input beam. They can be made out of fused silica, silicon, plastic, or other materials covering wavelengths from 193 nm to 20 um. With the help of microprocessing, diffusers implemented in accordance with the teachings of the present invention can be made with minimal zero order hot spots (often less than 1%) and efficiencies as high as 95%. The structures that make a diffuser work are called scatter centers. These are the elementary surface units that direct incoming light rays into different directions. The clustering of millions of scatter centers over a large area combines to provide the scattering properties of the diffuser. The typical scatter center is a microlens element, as illustrated in FIG. 7. To achieve greater than 90% conversion efficiency, each scatter center is individually designed to implement a certain light-control task. The surface structure as well the statistical distribution of scatter centers is carefully designed and fabricated.

The use of optical diffuser makes it possible to achieve almost any shape of laser beam with any shape of beam intensity profile. In one embodiment of the present invention a diffuser may be used to adjust a characteristic of the laser beam, such as beam intensity profile, divergence angle, and beam shape. For example, the diffuser may be used to adjust the intensity profile of the beam. In some cases, a beam with a unique intensity profile is required such as flat-top and donut-like to optimize seal strength and quality. This can be achieved by inserting a beam diffuser between the lenses. In one embodiment, to achieve strong sealing with uniform heating, a beam having a central deepened intensity profile (i.e. M-shaped profile) is required. The key to achieving such an intensity profile is to choose the diffuser capable of converting a Gaussian intensity profile into an M-shaped profile with minimal residual zero-order (i.e. central peak).

Figure 8A:
FIG. 8 shows a simulation of a beam intensity achieved with a diffuser implemented in accordance with the teachings of the present invention.
Figure 8B:
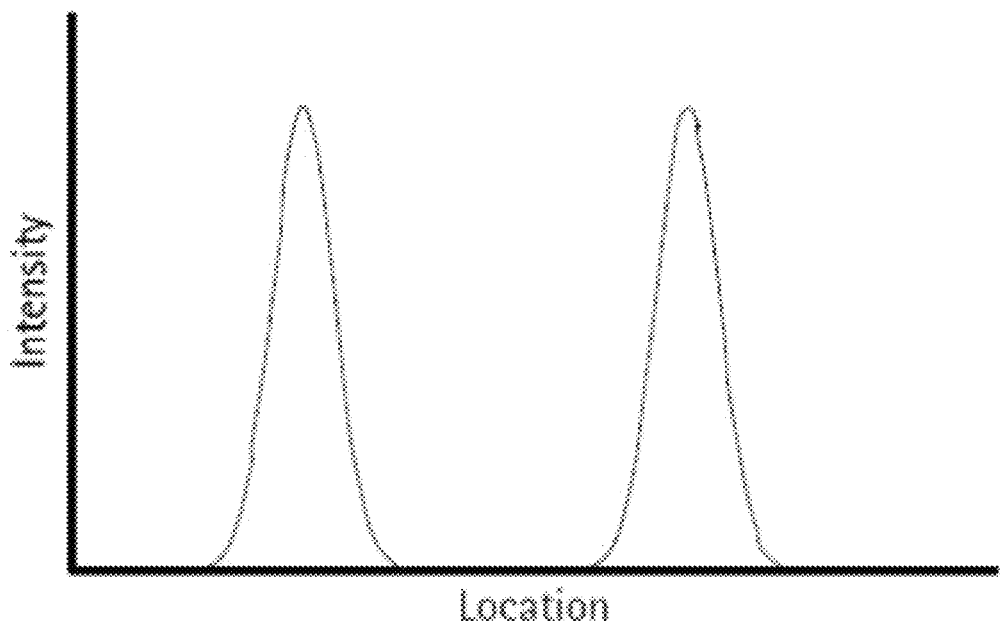

In frit sealing, the beam shape and intensity profile are especially important for achieving strong sealing. In one embodiment, the diffuser is used to convert a Gaussian beam with higher intensity in the center into a donut-shaped beam with lower intensity in the center than the edges of the beam. FIG. 8A displays a beam intensity profile, which is achieved by adding a beam diffuser between the lenses of the beam shaper shown in FIG. 1. FIG. 8B is an example of the intensity profile .vs. location. The diffuser redistributes power from an original circular beam to the edge and the lenses re-image the beam into an elliptical ring shown as FIG. 8A. In this embodiment, the beam intensity profile is controlled by the diffuser while the beam size is controlled by the lenses. Using a different diffuser can change the power intensity without changing the beam shape while changing the lens distance leads to different beam sizes without changing beam intensity profile. Therefore, the beam shaper implemented in accordance with the teachings of the present invention (i.e., FIG. 1) can control the beam size and power intensity independently.

Figure 9:
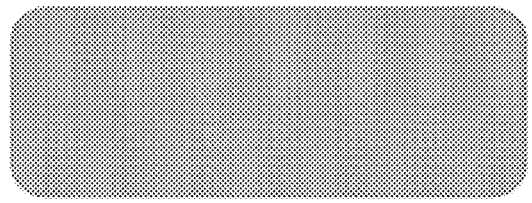
FIG. 9 displays a photograph of rectangular beam achieved with a diffuser implemented in accordance with the teachings of the present invention.

In one embodiment, the diffuser is used to convert a circular Gaussian beam into a rectangular-like beam with fairly uniform intensity over the beam or slightly higher intensity around the edges as shown in FIG. 9. In this case, the aspect ratio is controlled by lens distance as well. When the beam is used for frit sealing, the beam changes from aspect ratio of approximately 2~4 along the straight portion while it reduces to ~1 at corners to avoid potential damage to electrical leads and display elements.

Figure 10:
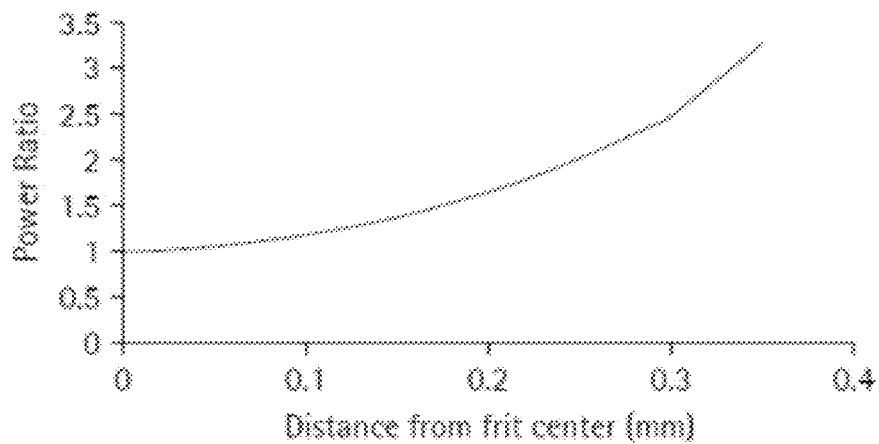
FIG. 10 displays an intensity vs. location plot of a beam generated with a diffuser.
Figure 11:
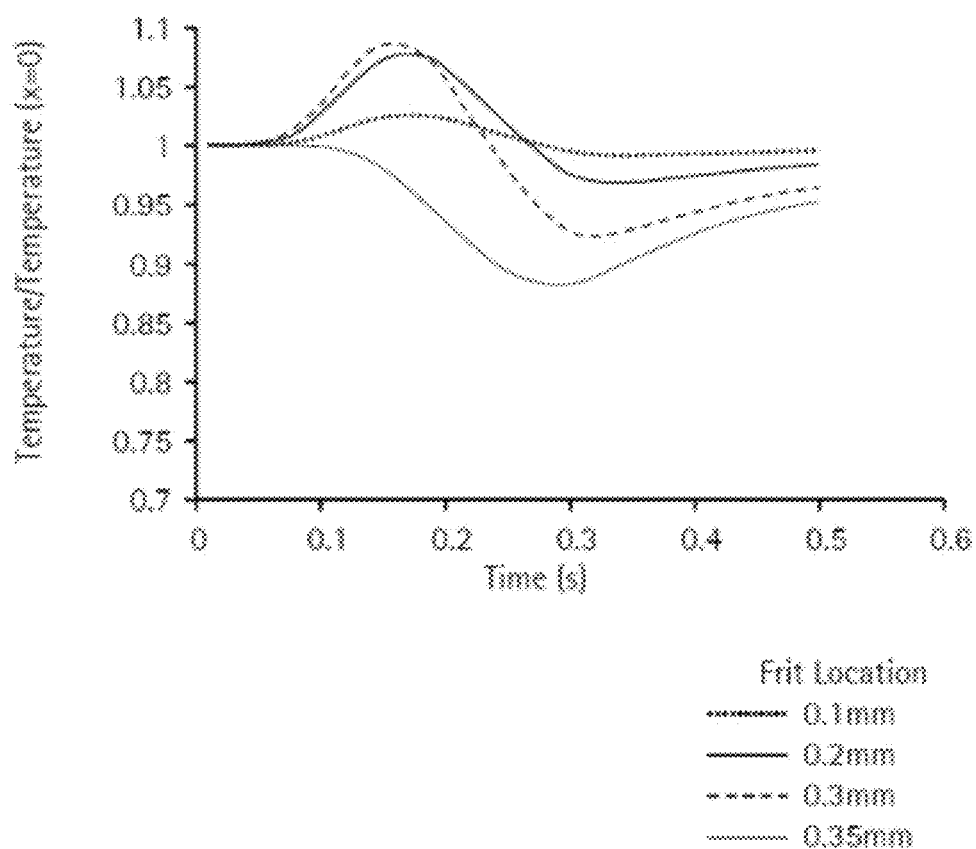
FIG. 11 displays a normalized frit temperature (normalized to frit center temperature) vs. laser exposure time at different locations when a reshaped beam with intensity profile shown in FIG. 10 is used.

In accordance with the teachings of the present invention, a new beam profile can be constructed. The power intensity is lower in the center of the laser beam and increases as you move from the center of the laser beam to the edge of the laser beam. For a 0.7-mm-wide frit, the ratio of power intensity between frit edge and frit center is 3.23, as shown in FIG. 10. When such a beam is used to illuminate the frit, the temperature difference across the frit width is noticeably less than that of conventional approach using a Gaussian beam with an optical mask. This more uniform temperature across the frit width leads to uniform heating of the frit, therefore the bonding of the frit to the substrate is more uniform across the width, and better utilization of frit width is achieved. Since there is more frit bonding area and stronger mechanical strength this new beam profile can increase the mechanical strength of a sealed OLED device.

In one embodiment, the laser power is reduced when the beam passes through the area including electrical leads across the frit while the sealing speed remains unchanged. As the frit volume in the region is smaller than that of region without electrical leads, reducing power can avoid overheating of the region and thus prevent the electrical leads from potential damage. The power reduction is dependent on the size and material of both frit and electrical leads. Normally, the power should be reduced to less than 15%, preferably, less than 10%.

It should also be understood that while the present invention has been described in detail with respect to certain illustrative and specific aspects thereof, it should not be considered limited to such, as numerous modifications are possible without departing from the broad scope of the present invention as defined in the appended claims.

What is claimed is:

1. A method of sealing a glass package, the glass package comprising a first substrate, a second substrate and a frit pattern positioned between the first substrate and the second substrate, the frit pattern comprising straight sections and curved sections, the method comprising the steps of: focusing a laser beam spot onto the flit pattern, the laser beam spot having a center portion and an edge portion, wherein the laser beam spot has a power intensity profile achieved by passing the laser beam through a diffuser, and dynamically changing the power intensity profile of the laser beam via the diffuser in real-time as the laser beam traverses the frit pattern; modifying the beam spot via the diffuser such that the power at the edge portion of the laser beam spot is greater than the power at the center portion of the laser beam spot; and sealing the glass package by traversing the laser beam spot along the frit pattern.

2. The method of claim 1, wherein the power of the center portion is about 2 to about 4 times less than the power at the edge portion.

3. The method of claim 1, wherein the power of the center portion is about 2 to about 3 times less than the power at the edge portion.

4. The method of claim 1, wherein the laser beam spot is an elliptical laser beam spot with an aspect ratio in the range of about 1 to about 3.

5. The method of claim 1, wherein the laser beam spot is a rectangular laser beam spot with an aspect ratio in the range of about 1 to about 3.

6. The method of claim 1, wherein the laser beam spot includes an aspect ratio of about 2—about 4 as the laser beam spot traverses the straight sections of the frit pattern.

7. The method of claim 1, wherein the laser beam spot includes an aspect ratio of less than 1 as the laser beam spot traverses the curved sections of the frit pattern.

8. A method of operating a beam shaper, the beam shaper comprising a first lens, a second lens, a distance between the first lens and the second lens, and a diffuser, the method comprising the steps of:
   generating a first laser beam spot with the beam shaper such that the first laser beam spot includes characteristics of shape and intensity profile;
   traversing a portion of a frit pattern with the first laser beam spot;
   generating a second laser beam spot from the first laser beam spot by using the beam shaper to dynamically change at least one of the first laser beam spot characteristics of shape and intensity profile in real-time as the first laser beam spot traverses the frit pattern; and traversing another portion of the frit pattern with the second laser beam spot.

9. The method of claim 8, wherein the second laser beam spot is generated by changing the distance.

10. The method of claim 8, wherein the second laser beam spot is generated by changing the diffuser.

11. The method of claim 8, wherein a shape of the second laser beam spot is different from the shape of the first laser beam spot.

12. The method of claim 8, wherein second intensity profile of the second laser beam spot is different from the first intensity profile of the first laser beam spot.

13. The method of claim 8, wherein the first laser beam spot further comprises a first power and the second laser beam spot further comprises a second power that is different from the first power.

14. The method of claim 8, wherein the first laser beam spot further comprises a first frit utilization and the second laser beam spot further comprises a second frit utilization that is different from the first frit utilization.

15. The method of claim 8, the first laser beam spot comprising a center portion and an edge portion, wherein the center portion has a first power and the edge portion has a second power, wherein the second power is greater than the first power, and the second laser beam spot further comprises a center portion and an edge portion, wherein the center portion has a third power and the edge portion has a fourth power, wherein the fourth power is greater than the third power, and wherein the first power is different than the third power and the second power is different than the fourth power.

* * * * *